US011688993B2

(12) United States Patent
Brückner et al.

(10) Patent No.: US 11,688,993 B2
(45) Date of Patent: Jun. 27, 2023

(54) METHOD OF PRODUCING A PLURALITY OF LASER DIODES AND LASER DIODE

(71) Applicant: OSRAM Opto Semiconductors GmbH, Regensburg (DE)

(72) Inventors: John Brückner, Regensburg (DE); Sven Gerhard, Alteglofsheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 269 days.

(21) Appl. No.: 16/628,050

(22) PCT Filed: Jul. 26, 2018

(86) PCT No.: PCT/EP2018/070334
§ 371 (c)(1),
(2) Date: Jan. 2, 2020

(87) PCT Pub. No.: WO2019/020761
PCT Pub. Date: Jan. 31, 2019

(65) Prior Publication Data
US 2021/0119408 A1    Apr. 22, 2021

(30) Foreign Application Priority Data
Jul. 28, 2017  (DE) .......................... 102017117136.3

(51) Int. Cl.
*H01S 5/02* (2006.01)
*H01S 5/22* (2006.01)

(52) U.S. Cl.
CPC .......... *H01S 5/0202* (2013.01); *H01S 5/0203* (2013.01); *H01S 5/0207* (2013.01); *H01S 5/22* (2013.01)

(58) Field of Classification Search
CPC .......... H01S 5/02–0218; H01S 5/4025; H01S 5/4031; H01S 5/42; H01S 5/22;
(Continued)

(56) References Cited

U.S. PATENT DOCUMENTS 4,237,601 A * 12/1980 Woolhouse ......... H01L 33/0025
438/33
5,185,290 A     2/1993 Aoyagi et al.
(Continued)

FOREIGN PATENT DOCUMENTS

CN    101136535 A    3/2008
CN    104871378 A    8/2015
(Continued)

OTHER PUBLICATIONS

The Decision to Grant a Patent dated Aug. 3, 2021, of counterpart Japanese Patent Application No. 2020-504176, along with an English translation.
(Continued)

*Primary Examiner* — Xinning (Tom) Niu
*Assistant Examiner* — Delma R Fordé
(74) *Attorney, Agent, or Firm* — DLA Piper LLP (US)

(57) ABSTRACT

A method of producing a plurality of laser diodes includes providing a plurality of laser bars in a composite, wherein the laser bars each include a plurality of laser diode elements arranged side by side, and the laser diode elements include a common substrate and a semiconductor layer sequence arranged on the substrate, and a division of the composite at a longitudinal separation plane extending between two adjacent laser bars leads to formation of laser facets of the laser diodes to be produced, and structuring the composite at at least one longitudinal separation plane, wherein a structured region is produced in the substrate.

9 Claims, 10 Drawing Sheets

(58) Field of Classification Search
CPC ........ B28D 5/0005–0052; H01L 21/78; H01L 21/70; H01L 21/77; H01L 21/7806
See application file for complete search history.

(56) References Cited

U.S. PATENT DOCUMENTS

| | | | |
|---|---|---|---|
| 5,393,707 | A | 2/1995 | Canning |
| 5,593,815 | A | 1/1997 | Ahn et al. |
| 5,629,233 | A * | 5/1997 | Chand ................ H01S 5/0201 438/33 |
| 7,924,897 | B2 | 4/2011 | Ohno |
| 8,324,004 | B2 | 12/2012 | Kwak et al. |
| 9,608,401 | B2 | 3/2017 | Enzmann et al. |
| 2002/0018499 | A1* | 2/2002 | Kuniyasu ............ H01S 5/024 372/45.01 |
| 2003/0030053 | A1* | 2/2003 | Kawakami ............ B82Y 20/00 257/72 |
| 2007/0093041 | A1 | 4/2007 | Tanaka et al. |
| 2008/0199983 | A1 | 8/2008 | Nakamura et al. |
| 2009/0137098 | A1 | 4/2009 | Sakamoto |
| 2009/0185594 | A1 | 7/2009 | Hiroyama et al. |
| 2009/0262771 | A1 | 10/2009 | Inoue et al. |
| 2009/0325334 | A1* | 12/2009 | Kwak ................ H01L 33/0093 257/E33.013 |
| 2011/0158276 | A1* | 6/2011 | Takagi .............. H01S 5/320275 438/31 |
| 2012/0263204 | A1 | 10/2012 | Hashimoto et al. |
| 2013/0142209 | A1* | 6/2013 | Tanisaka ............ H01S 5/0207 438/33 |
| 2013/0148681 | A1 | 6/2013 | Hamaguchi et al. |
| 2017/0264073 | A1* | 9/2017 | Gerhard ................ H01S 5/0202 |
| 2019/0036294 | A1* | 1/2019 | Gerhard ................ H01S 5/3201 |
| 2019/0052062 | A1* | 2/2019 | Loeffler ................ H01S 5/0207 |
| 2020/0169058 | A1* | 5/2020 | Sato ........................ H01S 5/0206 |
| 2020/0388988 | A1* | 12/2020 | Enzmann .............. H01S 5/0202 |

FOREIGN PATENT DOCUMENTS

| | | | | |
|---|---|---|---|---|
| DE | 29 41 476 | | 4/1980 | |
| DE | 4025144 | A1 | 2/1998 | |
| DE | 69 315 797 | | 7/1998 | |
| DE | 101 62 421 | A1 | 6/2002 | |
| DE | 69 711 478 | | 11/2002 | |
| DE | 10 2014 112 902 | | 3/2016 | |
| EP | 2528175 | A1 | 11/2012 | |
| JP | 2001-085736 | A | 3/2001 | |
| JP | 2001085736 | * | 3/2001 | ............. H01S 5/323 |
| JP | 2001223429 | * | 8/2001 | ............. H01S 5/041 |
| JP | 2011-146653 | A | 7/2011 | |
| JP | 2012-243866 | A | 12/2012 | |
| WO | WO-2012084321 | A * | 6/2012 | ............ B28D 5/0011 |
| WO | WO-2016037863 | A1 * | 3/2016 | ................ H01S 5/22 |

OTHER PUBLICATIONS

Notification of Reasons for Refusal dated Feb. 17, 2021, of counterpart Japanese Application No. 2020-504176, along with an English translation.

Summons for a Hearing dated Feb. 25, 2022, of counterpart German Patent Application No. 10 2017 117 136.3, along with an English.

Official Action dated May 30, 2022, of counterpart German Patent Application No. 10 2017 117 136.3, along with an English translation.

* cited by examiner

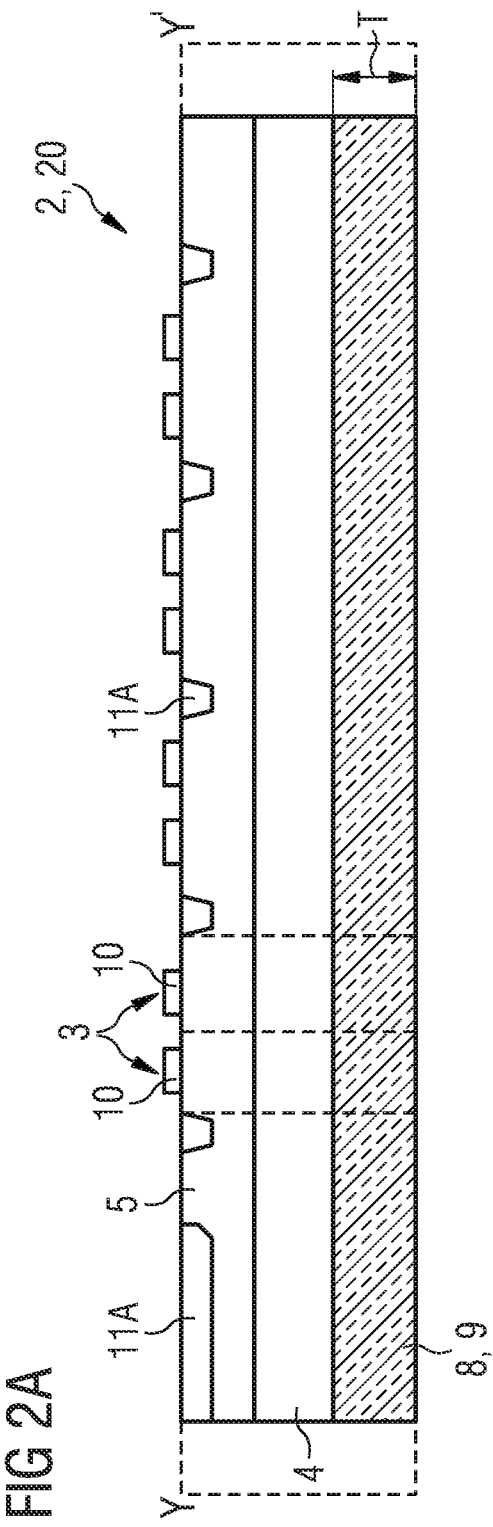
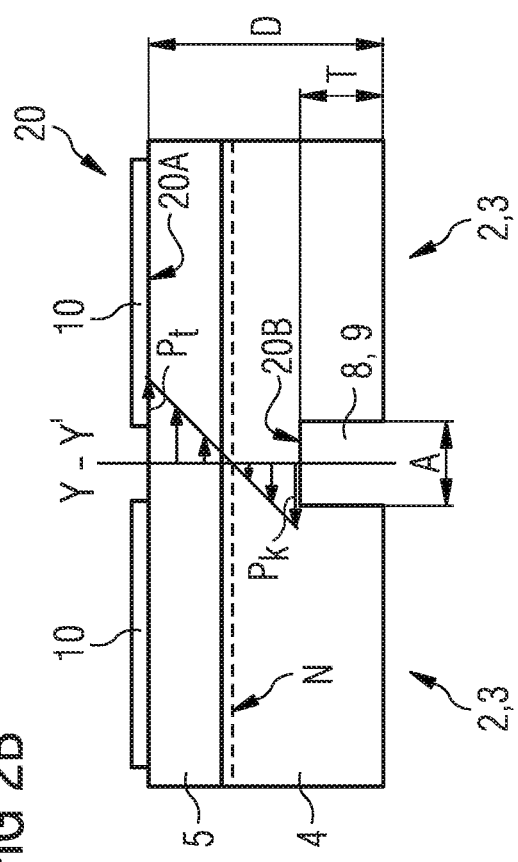

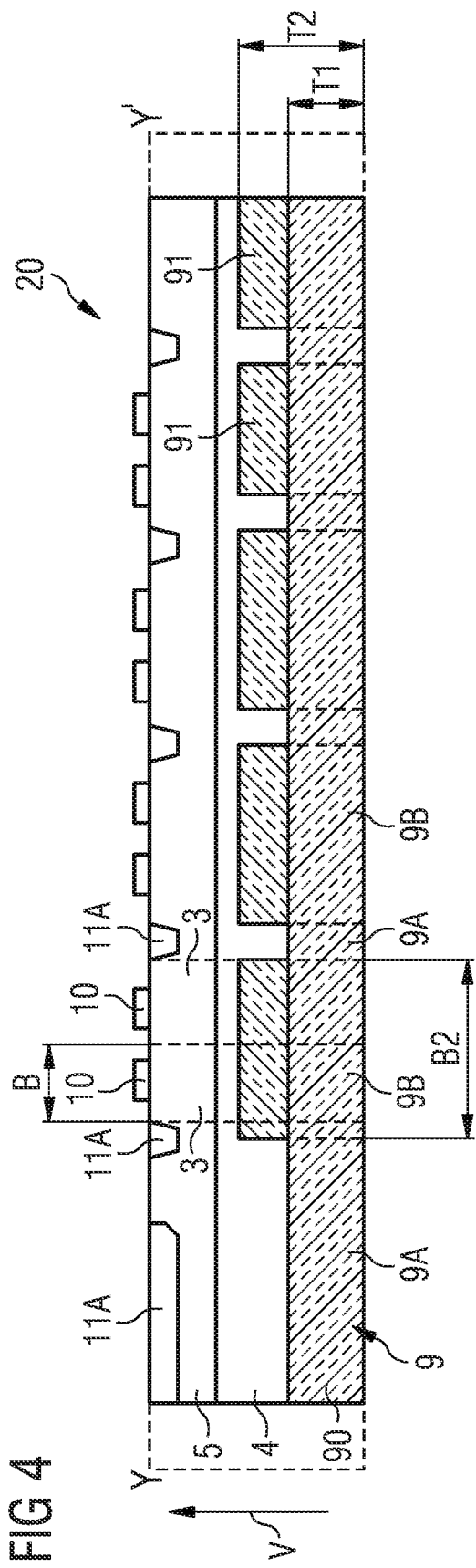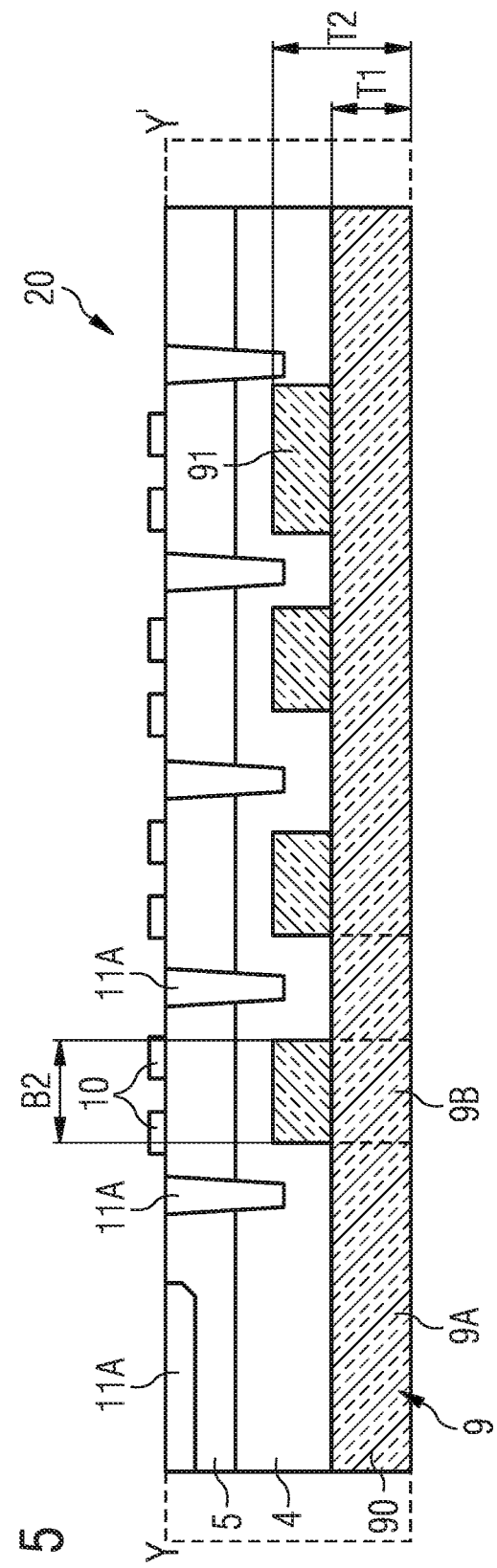

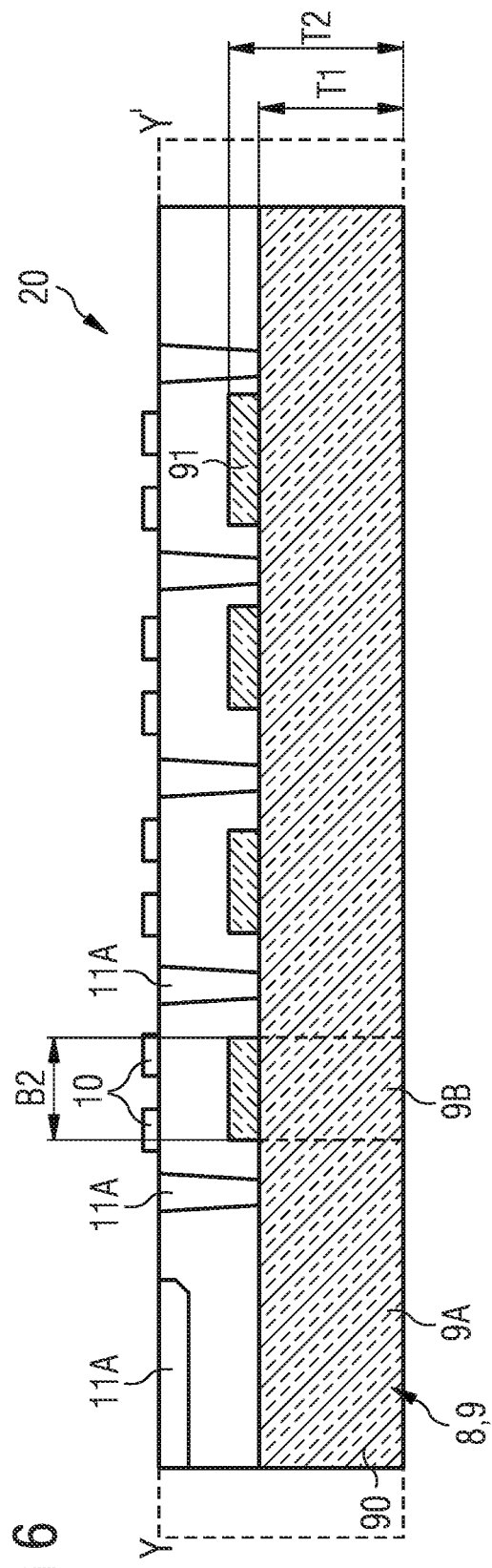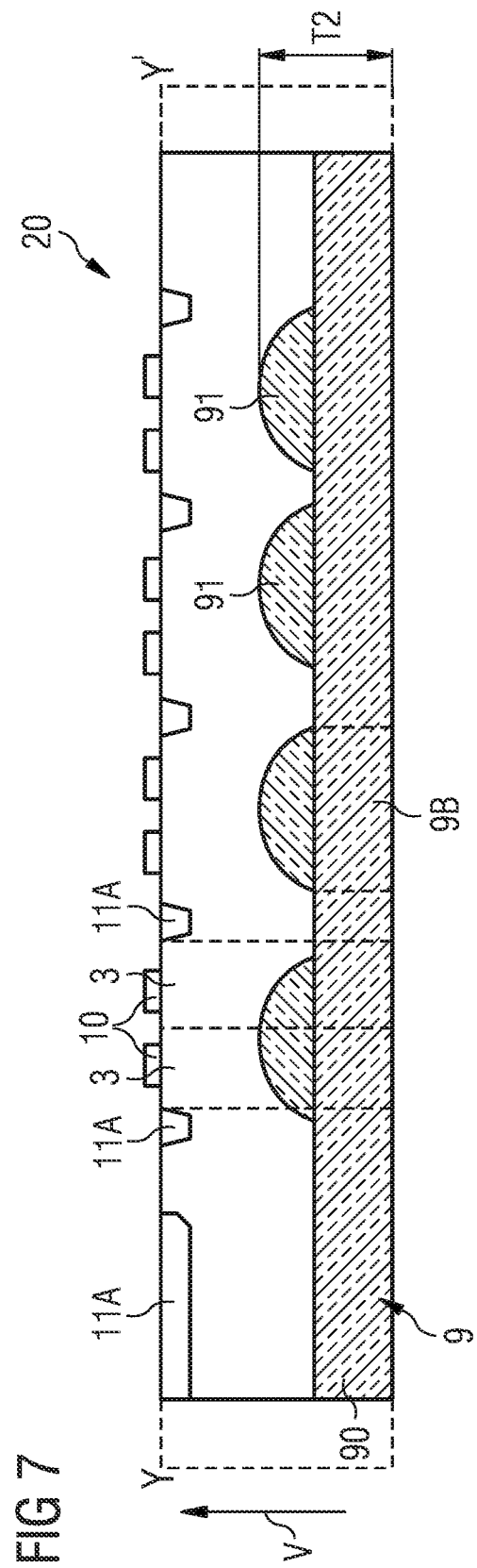

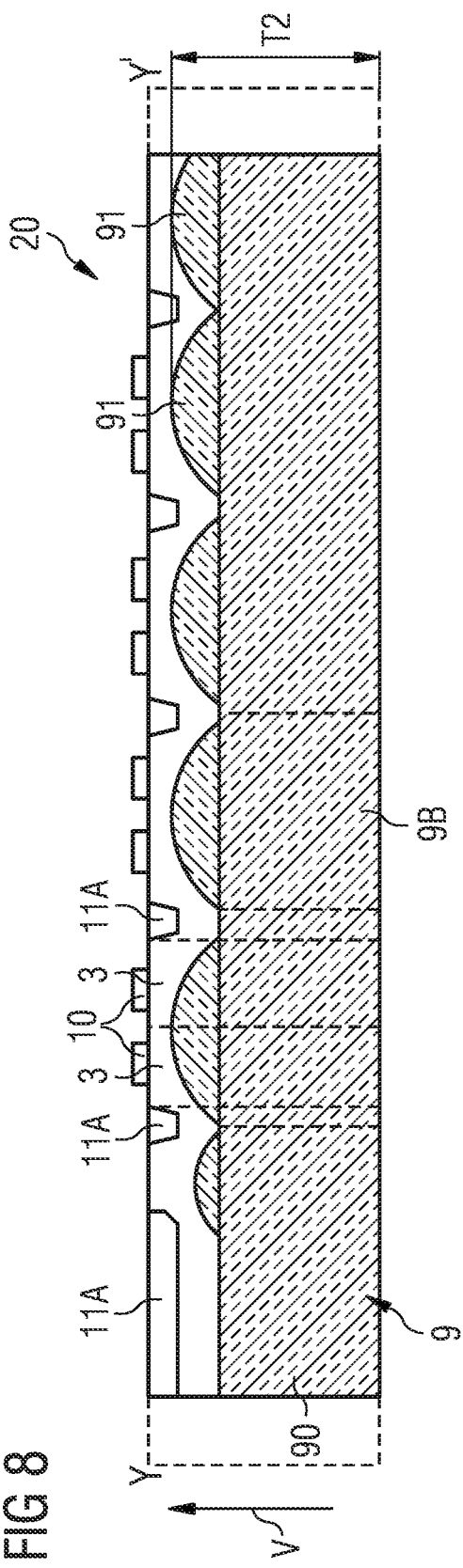

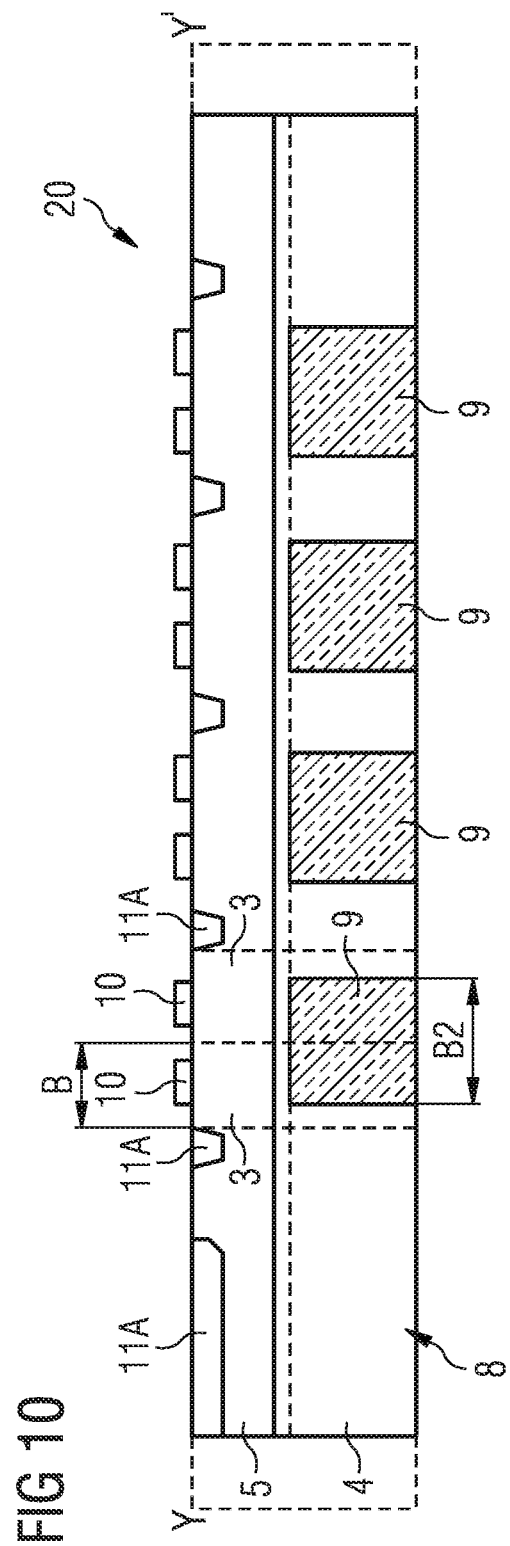

METHOD OF PRODUCING A PLURALITY OF LASER DIODES AND LASER DIODE

TECHNICAL FIELD

This disclosure relates to a method of producing a plurality of laser diodes, wherein the laser diodes are singulated from a plurality of laser bars present in a composite, and a laser diode that can be produced with the method.

BACKGROUND

One possible way of singulating laser bars arranged in a composite is breaking the laser bars. The composite is preferably broken precisely at crystal planes of a material used for the laser bars to form laser facets of the laser diodes to be produced. Ideally, the fracture surfaces are atomically smooth to exhibit low roughness and sufficient optical reflectivity suitable for laser operation.

Formation of the laser facets, however, represents a technical challenge, as various factors such as the type of breaking method, initiation of the break at notches as well as global and local stress conditions of the laser bar composite influence the quality of the laser facets. For example, under unfavorable stress conditions, crystal steps can form on the laser facets that impair reflectivity and lead to a lower light yield and also represent a quality risk as they can lead to spontaneous failures. However, a fundamental structural change in the laser bar composite cannot be made without further ado since this can impair both the breaking and the functionality of the finished laser diodes.

It could therefore be helpful to provide an improved method of producing a plurality of laser diodes and a laser diode of improved quality.

SUMMARY

We provide a method of producing a plurality of laser diodes including providing a plurality of laser bars in a composite, wherein the laser bars each include a plurality of laser diode elements arranged side by side, and the laser diode elements include a common substrate and a semiconductor layer sequence arranged on the substrate, and a division of the composite at a longitudinal separation plane extending between two adjacent laser bars leads to formation of laser facets of the laser diodes to be produced, and structuring the composite at at least one longitudinal separation plane, wherein a structured region is produced in the substrate.

We also provide the laser diode including a semiconductor body having a substrate and a semiconductor layer sequence arranged on the substrate and includes an active zone suitable for generating electromagnetic radiation, wherein the semiconductor body includes a first main surface and a second main surface opposite the first main surface, and at least one first and second laser facet arranged transversely to the first and second main surfaces, and at least one structured facet region located at the transition between the second main surface and at least one of the two laser facets, wherein the structured facet region has an indentation, wherein the indentation extends from the substrate through the semiconductor layer sequence to the active zone at the most.

We further provide a method of producing a plurality of laser diodes including providing a plurality of laser bars in a composite, wherein the laser bars each include a plurality of laser diode elements arranged side by side, and the laser diode elements include a common substrate and a semiconductor layer sequence arranged on the substrate, and a division of the composite at a longitudinal separation plane extending between two adjacent laser bars leads to formation of laser facets of the laser diodes to be produced, and structuring the composite at at least one longitudinal separation plane, wherein a structured region is produced in the substrate, and the structured region includes a depression running continuously along the longitudinal separation plane, the depression including alternately arranged regions of different depths along the longitudinal separation plane.

BRIEF DESCRIPTION OF THE DRAWINGS

FIG. 2A shows a schematic longitudinal section view of the laser bar composite according to the first example.

FIG. 2B shows a section of a schematic cross-sectional view of the laser bar composite according to the first example.

FIGS. 4 to 10 each show schematic longitudinal section views, and FIGS. 11 to 15 each show schematic cross-sectional views of laser bar composites according to various examples.

Figure 1:
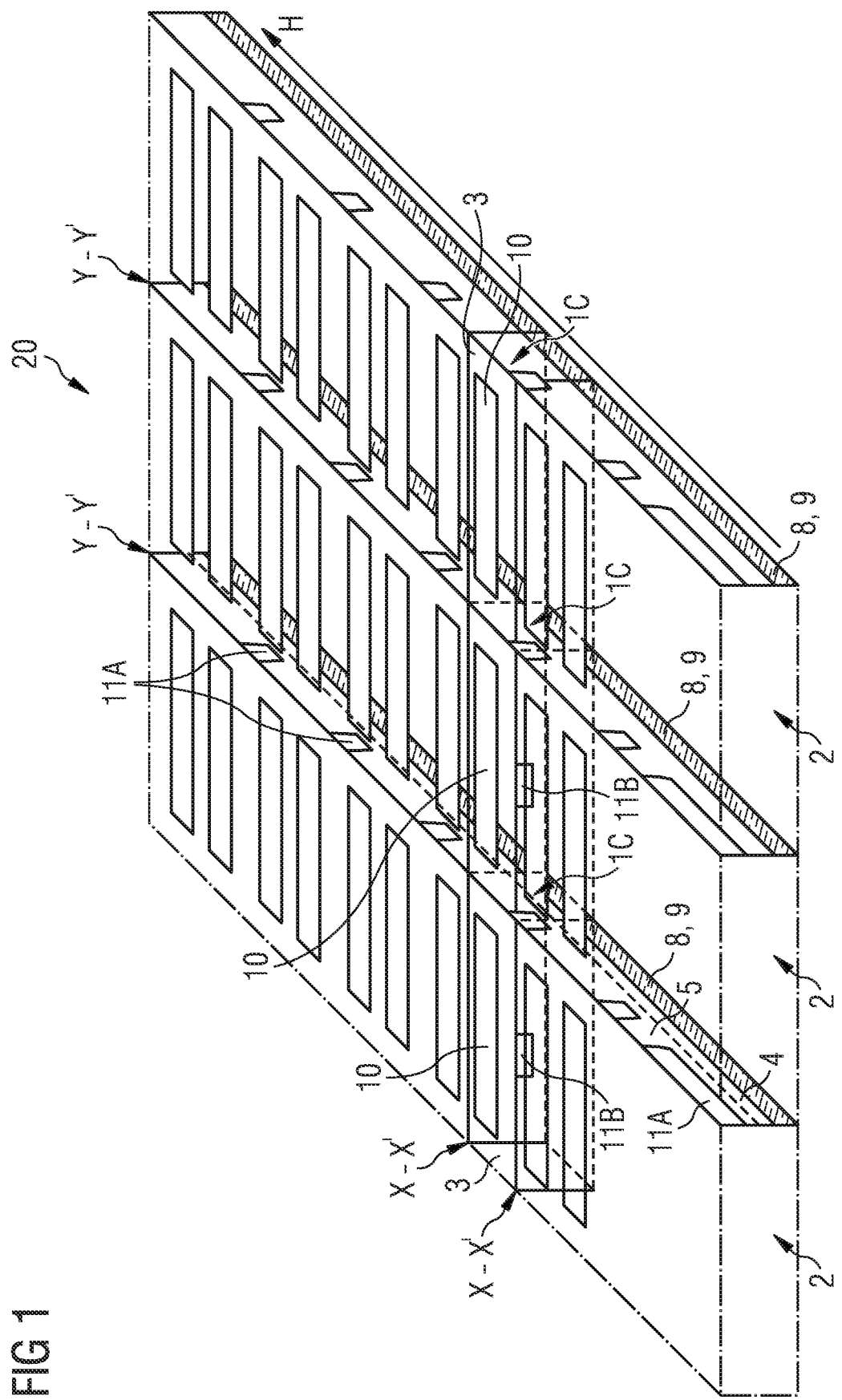
FIG. 1 shows a schematic perspective view of a laser bar composite according to a first example.

LIST OF REFERENCE SIGNS 1 laser diode
1A first main surface
1B second main surface
1C laser facet
1D side surface
2 laser bar
3 laser diode element
4 substrate
5 semiconductor layer sequence
6 active zone
7 semiconductor body
8 structured region
9 depression
9A, 9B region of the depression
90, 91 portion of the depression
10 contact area
11A, 11B separation point
12 indentation
13 structured facet region
14 passivation layer
15 web structure
20 laser bar composite
20A first main surface
20B second main surface
A, A1, A2, A2' lateral dimension
B, B2 width
D thickness
H main direction of extension
L1, L2 lateral direction
N neutral area
$P_t$ tensile stress $P_k$ compressive stress
T, T1, T2 depth
V vertical direction
X-X' transverse separation plane
Y-Y' longitudinal separation plane

DETAILED DESCRIPTION

Our method of producing a plurality of laser diodes may comprise the following steps:

providing a plurality of laser bars in a composite, wherein the laser bars each comprise a plurality of laser diode elements arranged side by side, and the laser diode elements comprise a common substrate and a semiconductor layer sequence arranged on the substrate, and wherein a division of the composite at a longitudinal separation plane extending between two adjacent laser bars leads to formation of laser facets of the laser diodes to be produced, and structuring the composite at at least one longitudinal separation plane, wherein a structured region is produced in the substrate.

The method steps mentioned above are carried out in the specified sequence.

Advantageously, structuring the substrate, which is less important for optical reflectivity than the semiconductor layer sequence, can avoid a fundamental intervention in the laser design.

Providing the plurality of composite laser bars preferably comprises providing a substrate and a semiconductor layer sequence comprising a plurality of semiconductor layers. The semiconductor layer sequence is preferably structured so that a semiconductor layer sequence can be assigned to each laser diode element.

The semiconductor layer sequence comprises in particular at least one active zone suitable for generating electromagnetic radiation. The layers of the semiconductor layer sequence preferably contain at least one III/V semiconductor material such as a material from the material systems InxGayAl1-x-yP, InxGayAl1-x-yN or InxGayAl1-x-yAs, each with $0 \le x$, $y \le 1$ and $x+y \le 1$. III/V semiconductor materials are particularly suitable for generating radiation in the ultraviolet (InxGayAl1-x-yN), visible (InxGayAl1-x-yN, especially for blue to green radiation, or InxGayAl1-x-yP, especially for yellow to red radiation) and infrared (InxGayAl1-x-yAs) spectral ranges. Materials for the substrate include sapphire, SiC, InP, GaAs and/or GaN. The substrate, for example, is the growth substrate on which the semiconductor layers have sequentially grown layer by layer.

The active zone of the semiconductor layer sequence preferably has a pn junction, a double heterostructure, a single quantum well structure (SQW) or a multiple quantum well structure (MQW) for radiation generation. The term quantum well structure covers in the context of the application in particular any structure in which charge carriers can experience a quantization of several energy states by inclusion (confinements). In particular, the term "quantum well structure" does not contain any information about the dimensionality of the quantization. It thus includes quantum troughs, quantum wires and quantum dots and any combination of these structures.

Furthermore, the semiconductor layer sequence has in particular an n-type semiconductor region and a p-type semiconductor region, the active zone being arranged in between. The n-type semiconductor region, the active zone and the p-type semiconductor region may each have one or more layers. It is possible that the n-type semiconductor region, the active zone and the p-type semiconductor region contain one or more undoped layers.

The longitudinal separation planes are preferably aligned along the individual laser bars, in particular parallel to the alignment of the individual laser bars. The singulation of the composite into a plurality of laser diodes preferably takes place at the longitudinal separation planes and at transverse separation planes running transversely to the longitudinal separation planes. Preferably, the composite is singulated by breaking at the longitudinal and transverse separation planes. In the composite, it is advantageous to create separation points on a side opposite the substrate at the longitudinal separation plan that are intended for a targeted division of the composite. In addition, the composite can be formed with further separation points on a side opposite the substrate along the transverse separation plane. The separation points are in particular depressions in the composite that allow a targeted division.

The term "laser facet" refers to an interface, in particular a side surface, of the laser diode elements, forming part of an optical resonator in the finished laser diode. The laser facet is characterized by the fact that it is smooth. In particular, "smooth" means that the surface roughness of the laser facet is significantly smaller than the wavelength of the light generated by the laser diode during operation, preferably smaller than half the wavelength, particularly preferably smaller than a quarter of the wavelength.

Preferably, the laser diode elements are formed on a first main surface, each with a contact area, in particular a p-conductive contact area. In the finished laser diode, the contact area serves as an electrical connection area. In addition, the laser diode elements can be formed on a second main surface opposite the first main surface, each with a further contact area, in particular an n-conducting contact area. In the finished laser diode, the further contact area serves as a further electrical connection area. Suitable materials for the contact areas are electrically conductive materials, preferably pure metals or metal compounds.

Structuring the composite can be carried out by mechanical sawing or an etching method. Possible etching methods include laser etching, wet chemical etching or dry etching. Structuring includes in particular a material removal of the substrate, which means that a thickness of the substrate is locally reduced.

By structuring, a structured region can be created in the substrate at the longitudinal separation plane. Preferably, the structured region has a main direction of extension parallel to the alignment of the laser bars. Particularly preferably, the structured region is formed axially symmetrical with regard to the longitudinal separation plane.

The stress distribution can be advantageously influenced by the specifically introduced structured region. We found that the structured region can be used to increase the maximum tensile stress prevailing at a first main surface of the laser bar composite. Furthermore, it is possible to increase a maximum compressive stress prevailing at a second main surface opposite the first main surface by the structured region. For example, by locally reducing the thickness of the laser bar composite by 20%, the maximum tensile stress can be increased to double up to 10 times its value. The achievable values vary depending on the form of the structured region. An increase in the maximum tensile stress at the first main surface has a particularly favorable effect on the division process and leads to an improved quality of the laser facets.

The structured region may comprise a continuous, i.e. contiguous, depression running continuously along the longitudinal separation plane or along its main direction of extension. In particular, the structured region has only one depression. The only one depression extends along the longitudinal separation plane for the most part through the laser bar composite. Alternatively, the structured region may have several depressions separated from each other along the longitudinal separation plane, with two adjacent depressions being separated from each other by a substrate region. Preferably, the at least one depression is delimited laterally, i.e. in directions parallel to a main plane of extension of the substrate, at least partially by the substrate. The depth of the at least one depression is preferably 10 to 90% of the thickness of the composite, the limits being included. In particular, the depth is 1 µm to 100 µm, the limits being included.

Preferably, the continuously running depression has a prismatic, for example, cuboid, or (semi-)cylindrical shape. In a longitudinal section parallel to the longitudinal separation plane, the depression then has a polygonal shape in particular. For example, in a longitudinal section parallel to the longitudinal separation plane the continuous depression may have a rectangular shape. In particular, the depth of the depression does not change along the longitudinal separation plane.

Furthermore, the continuously running depression may comprise alternately arranged regions of different depths along the longitudinal separation plane. In particular, the deeper regions are arranged in the area of the laser diode elements so that the stress conditions can be influenced especially in the area of the laser diode elements. Preferably, the deeper regions each have a width larger than the width of the laser diode elements.

The continuously running depression may have a composite shape. For example, the composite shape can be composed of a larger portion and a plurality of smaller portions adjacent to the larger portion. Preferably the smaller portion follows the larger portion in a vertical direction. The vertical direction indicates in particular the direction in which the semiconductor layer sequence follows the substrate. For example, the larger portion can have the shape of a prism, especially a cuboid. Furthermore, the smaller portions can have the shape of a prism, especially a cuboid, a pyramid or a hemisphere. In particular, the deeper regions each consist of a section of the larger portion and a smaller portion, while the other regions consist of a section of the larger portion. Preferably, the smaller portions each have a width that is larger than the width of the laser diode elements. The width of the laser diode elements or laser diodes is preferably 50 µm to 1000 µm, particularly preferably 100 µm to 400 µm, the limits being included. In particular, the deeper regions or smaller portions are twice as wide as the laser diode elements or laser diodes.

The structured region may comprise a plurality of depressions. These can each have a polygonal or semicircular shape in a longitudinal section parallel to the longitudinal separation plane. The depressions can have the shape of a prism, in particular a cuboid, a pyramid, a cylinder or a hemisphere. Preferably, the depressions each have a width larger than a width of the laser diode elements.

Preferably, the structured region has a polygonal or semicircular shape in a cross section perpendicular to the longitudinal separation plane. In particular, in the cross section the at least one depression may have a polygonal shape such as a rectangular shape, or a semicircular shape such as a semi-oval or semicircle. A maximum lateral extension of the structured region determined perpendicular to the longitudinal separation plane is preferably 0.5 to 50 µm, the limits being included.

The structured region may extend into the substrate starting from a surface of the substrate facing away from the semiconductor layer sequence. Preferably, the surface of the substrate facing away from the semiconductor layer sequence is arranged on a rear side of the laser bar composite defined by the second main surface of the laser bar composite. The structured region at least partially penetrates the substrate. In other words, the structured region can end in or extend through the substrate and completely penetrate the substrate.

The semiconductor layer sequence of the laser diode elements may be formed with a web structure. The web structure is formed in particular by a raised region of the semiconductor layer sequence with a main direction of extension running in particular parallel to the transverse separation plane. The finished laser diodes are preferably so-called "ridge waveguide laser diodes," the web structure acting as a lateral waveguide for the emitted light. Alternatively, the laser diodes can be designed as wide-strip lasers. This eliminates the need for a web structure.

The laser diode may comprise a semiconductor body having a substrate and a semiconductor layer sequence arranged on the substrate and comprises an active zone suitable for generating electromagnetic radiation. The semiconductor body comprises a first main surface and a second main surface opposite the first main surface, and at least one first and second laser facet arranged transversely to the first and second main surfaces. "Transverse" means that a normal vector of the laser facets is not parallel to a normal vector of the first and/or second main surface(s). Preferably, the laser facets delimit the semiconductor body in a lateral direction. The lateral directions are arranged in a plane that is in particular parallel to a main plane of extension of the substrate. The first main surface is preferably a surface of the semiconductor layer sequence delimiting the semiconductor body on a side of the active zone facing away from the substrate. In addition to the laser facets, the semiconductor body can have further side surfaces that are each arranged transversely to the first and second main surfaces.

The laser diode advantageously has at least one structured facet region located at the transition between the second main surface and at least one of the two laser facets. The structured facet region has an indentation. In the area of the indentation, the semiconductor body has a reduced thickness. The indentation is in particular open on one side, i.e. the indentation is at most partially delimited laterally by the semiconductor body. Due to the structured facet region, the laser facets are at least approximately smooth and thus have a high optical reflectivity.

The structured facet region can extend parallel to an edge of the semiconductor body located at the transition between the second main surface and the laser facet.

Advantageously, the indentation may extend from the substrate through the semiconductor layer sequence to the active zone at the most. In particular, the laser diode remains largely unstructured in the area of the active zone. The indentation may have a uniform depth. Corresponding to the depression, the indentation may be 1 µm to 100 µm deep, the limits being included.

The indentation has a first lateral dimension corresponding at most to the width of the laser diode, i.e. the indentation extends at most over the entire width of the laser diode. Preferably, the indentation has a first lateral dimension of 50 µm to 1000 µm, particularly preferably 100 µm to 400 µm, the limits being included. Furthermore, the indentation has a second lateral dimension which preferably corresponds to half the lateral dimension of the structured region or the at least one depression, i.e. the indentation preferably has a second lateral dimension of 0.25 to 25 µm, the limits being included.

Furthermore, the indentation may have a polygonal, especially rectangular, shape in a cross section parallel to the laser facets. Furthermore, the indentation may have a polygonal shape or the shape of a quarter oval or quarter circle in a longitudinal section perpendicular to the laser facets.

The laser diode is preferably an edge emitter. During operation, laser radiation is emitted at one of the laser facets parallel to a normal vector of the laser facet.

Further advantages and developments of the method as well as the laser diode will become apparent from the explanations of FIGS. 1 to 16B.

In conjunction with FIGS. 1 to 15, various examples of a method as well as of a laser bar composite are described.

FIG. 1 shows a schematic perspective view of a composite 20 comprising a plurality of laser bars 2. The composite 20 may well have more than the laser bars 2 shown. The laser bars 2 each comprise a plurality of laser diode elements 3 arranged side by side, the number of which may differ from the number shown. FIGS. 2A and 4 to 10 show schematic longitudinal section views along a longitudinal separation plane y-y, and FIGS. 11 to 15 show schematic cross-sectional views of various examples of laser bar composites along a transverse separation plane x-x'.

In one example of a method of producing a plurality of laser diodes 1 (see FIGS. 16A and 16B), first the composite 20 of laser bars 2 is provided. The laser bars 2 each comprise a plurality of laser diode elements 3 arranged side by side that have a common substrate 4 and each have a semiconductor layer sequence 5 arranged on the substrate 4.

After providing the composite 20, a structuring, i.e. a structural change, of the composite 20 takes place at a longitudinal separation plane y-y', wherein a structured region 8 is produced in the substrate 4. The structuring includes in particular a material removal of the substrate 4, i.e. a thickness of the substrate 4 is locally reduced. The structuring can be carried out by mechanical sawing or an etching method. Possible etching methods include laser etching, wet chemical etching or dry etching.

Preferably, the structured region 8 has a main direction of extension H running parallel to the alignment of the laser bars 2. The structured region 8 can be formed axially symmetrical with respect to the longitudinal separation plane y-y or the main direction of extension H.

The laser diode elements 3 can be formed on a first main surface each with a contact area 10, in particular a p-conducting contact area. In the finished laser diode 1, the contact area 10 serves as an electrical connection area. Suitable materials for the contact areas 10 are electrically conductive materials, preferably pure metals or metal compounds.

In the composite 20, separation points 11A are generated on a side opposite the substrate 4 at the longitudinal separation plane y-y' intended for a targeted division of the composite 20. Furthermore, the composite 20 can be formed with further separation points 11B on a side opposite the substrate 4 along the transverse separation plane x-x'. The separation points 11A, 11B are depressions in the composite 20 that allow a targeted division. The separation points 11A, 11B in the examples of FIGS. 1 to 5 and 7 to 15 extend at most into the substrate 4 and end above the structured region 8, 9.

The composite 20 is divided into a plurality of laser bars 2, each at a longitudinal separation plane y-y' running between two adjacent laser bars 2. Furthermore, the separated laser bars 2 are singulated into a plurality of laser diodes 1 at a transverse separation plane x-x' running between two adjacent laser diode elements 3 and running transversely, in particular perpendicularly, to the longitudinal separation plane y-y. In particular, the singulation of the composite 20 is effected by breaking at the longitudinal and transverse separation lines y-y', x-x', the separation points 11A, 11B serving as predetermined breaking points. Preferably, the division process starts from the rear side of the composite 20, i.e. from the side of the substrate 4. The breaking process is similar to a 3-point bending test, for example.

By dividing the composite 20, each at a longitudinal separation plane y-y' running between two adjacent laser bars 2, laser facets 1C of the laser diodes 1 are formed at each of the laser diode elements 3.

In the example shown in FIGS. 1 and 2A, the structured region 8 has a continuously running depression 9 along the longitudinal separation plane y-y'. The depression 9 has a prismatic or cuboid shape (cf. FIG. 2B). Furthermore, the depression 9, as shown in FIG. 2A, has a rectangular shape in a longitudinal section parallel to the longitudinal separation plane y-y'. In particular, a depth T of the depression 9 does not change along the longitudinal separation plane y-y'. The depth T can be 1 µm to 100 µm, the limits being included. A maximum lateral extension A of the depression 9, determined perpendicular to the longitudinal separation plane y-y', is preferably 0.5 µm to 50 µm, the limits being included.

The stress distribution in the composite 20 can be advantageously influenced by the specifically introduced depression 9 or the structured region 8. This is illustrated by FIGS. 2B and 3B.

Figure 3A:
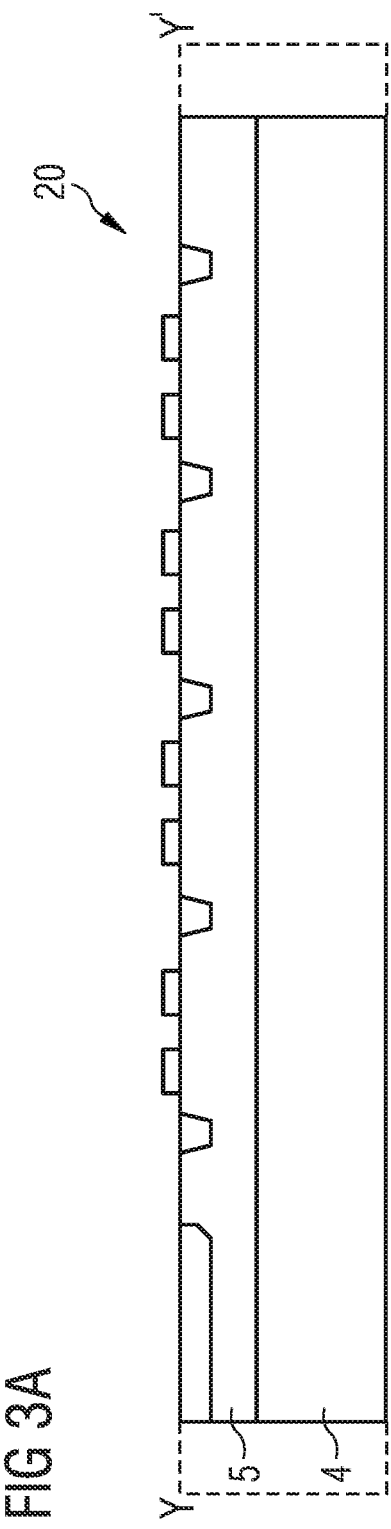
FIG. 3A shows a schematic longitudinal section view of a laser bar composite according to a comparative example.
Figure 3B:
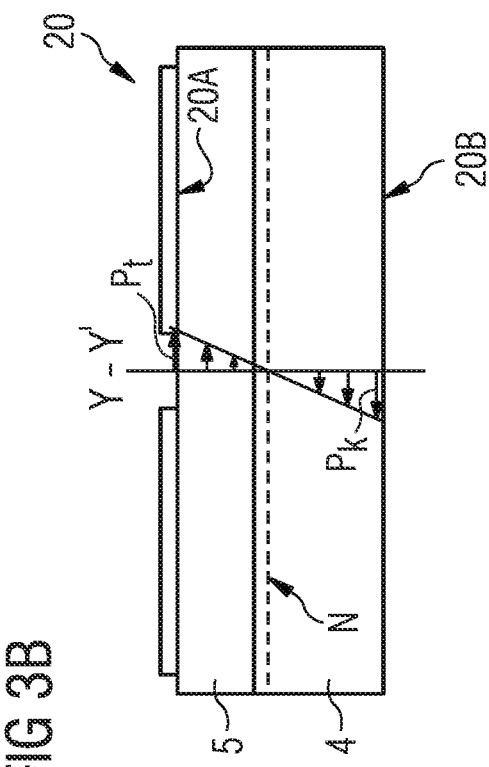
FIG. 3B shows a section of a schematic cross-sectional view of the laser bar composite according to the comparative example.
Figure 11:
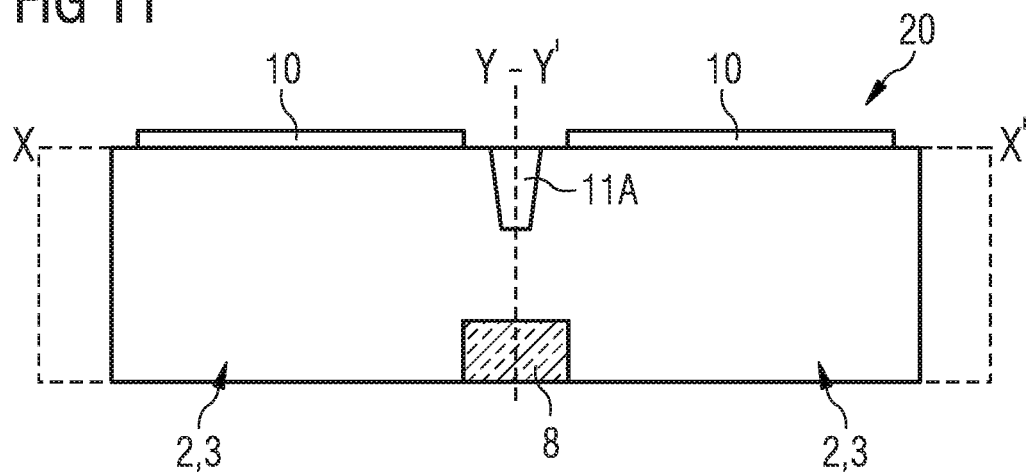

As can be seen in both FIGS. 2B and 3B, the tensile stress $P_t$ decreases linearly from a first main surface 20A of the composite 20 to a stress-free neutral area N. The compressive stress $P_k$ decreases linearly from a second main surface 20B of the composite 20 to the stress-free neutral area N. Using the structured region 8, the neutral area N can be shifted in the direction of the first main surface 20A. This allows the maximum tensile stress Pt occurring at the first main surface 20A to be increased. It also increases the maximum compressive stress Pk prevailing at the second main surface 20B. For example, with a local reduction of a thickness D of the laser bar composite 20 by 20%, the maximum tensile stress Pt can be increased to double up to 10 times its value. An increase in the maximum tensile stress Pt at the first main surface 20A has a particularly favorable effect on the division process and leads to an improved quality of the laser facets 1C.

FIGS. 4 to 9 show further examples of laser bar composites 20 in which, as in the first example, the structured regions 8 each have only one continuously running depression 9 extending through the laser bar composite 20. In contrast to the first example, however, the depth of the depressions 9 changes along the longitudinal separation plane y-y'. The depressions 9 each have alternately arranged regions 9A, 9B of different depths T1, T2. In particular, the deeper regions 9B are arranged in the area of the laser diode elements 3 so that the stress conditions can be influenced especially in the area of the laser diode elements 3.

The continuously running depression 9 may have a composite shape. For example, the composite shape may be composed of a larger portion 90 and a plurality of smaller portions 91 adjacent to the larger portion 90. Preferably, the smaller portion 91 follows the larger portion 90 in a vertical direction V. In particular, the deeper regions 9B each consist of a section of the larger portion 90 and a smaller portion 91, while the other regions 9A consist of a section of the larger portion 90. For example, the larger portion 90 can have the shape of a prism, in particular a cuboid. Furthermore, the smaller portions 91 may have the shape of a prism, in particular a cuboid, a pyramid, a cylinder or a hemisphere. Preferably, the smaller portions 91 or the deeper regions 9B each have a width B2 which is larger than a width B of the laser diode elements 3. The width B of the laser diode elements 3 or laser diodes 1 is preferably 50 μm to 1000 μm, particularly preferably 100 μm to 400 μm, the limits being included. In particular, the smaller portions 91 or deeper regions 9B are twice as wide as the laser diode elements 3 or laser diodes 1.

In the examples shown in FIGS. 4, 5 and 6, the shape of the depressions 9 is each composed of a larger prism-shaped, in particular cuboid, portion 90 and several smaller prism-shaped, in particular cuboid, portions 91. In the example shown in FIG. 5, the deeper regions 9B extend in the vertical direction V up to between the separation points 11A and are thus reduced in their width B2 compared to the example shown in FIG. 4. This also applies to the example shown in FIG. 6. Furthermore, in this example the separation points 11A extend up to the structured region 8. The continuous design of the structured region 8 with the separation points 11A facilitates singulation of the composite 20.

In the examples shown in FIGS. 7 and 8, the shape of the depressions 9 is composed of a larger prism-shaped, in particular cuboid, portion 90 and a plurality of smaller spherical portions 91. In the example shown in FIG. 8, the deeper regions 9B have a greater depth T2 than in the example shown in FIG. 7.

In the example shown in FIG. 9, the shape of the depression 9 is composed of a larger prism-shaped, in particular cuboid, portion 90 and several smaller pyramid-shaped or prism-shaped portions 91.

FIG. 10 shows another example of a laser bar composite 20 that differs from the previous examples in that the structured region 8 does not have a single depression 9, but several depressions 9 separated from one another, wherein each of two adjacent depressions 9 are separated from one another by a substrate region, i.e. a region of the substrate 4. The depressions 9 have a rectangular shape in a longitudinal section parallel to the longitudinal separation plane y-y'. The depressions 9 may have the three-dimensional shape of a prism, in particular a cuboid, or a cylinder. The depressions 9 each have a width B2 that is larger than the width B of the laser diode elements 3. The depressions 9 are arranged in the area of the laser diode elements 3 so that the stress conditions can be influenced especially in the area of the laser diode elements 3.

FIGS. 11 to 15 show various examples of laser bar composites 20 in a cross section arranged parallel to the transverse separation plane x-x'. In the examples shown in FIGS. 11 to 14, the structured region 8 has a polygonal shape. The polygonal shape can be rectangular (see FIG. 11), pentagonal (see FIG. 12), quadrangular (see FIG. 13) or triangular (see FIG. 14). In the example shown in FIG. 15, the structured region 8 has a semicircular shape that resembles, for example, a semi-oval or a semicircle.

Figure 12:
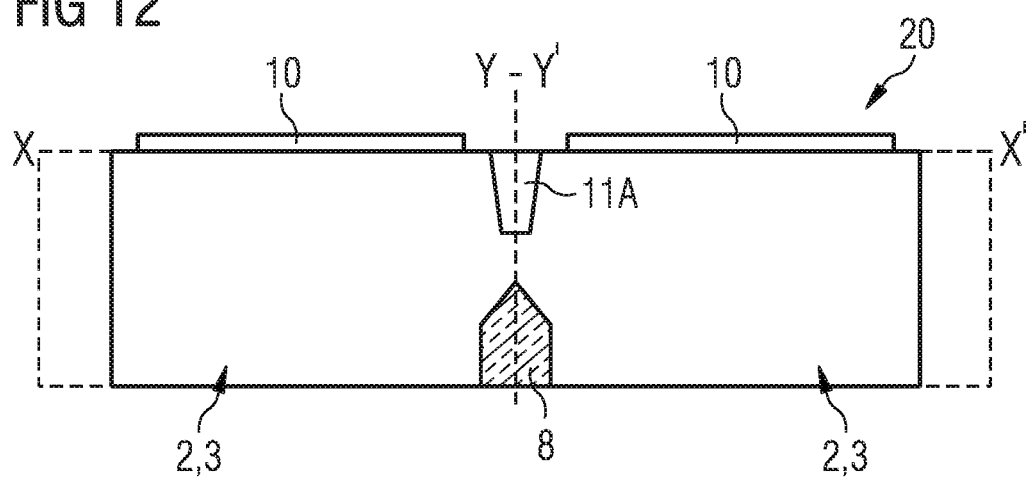
Figure 13:
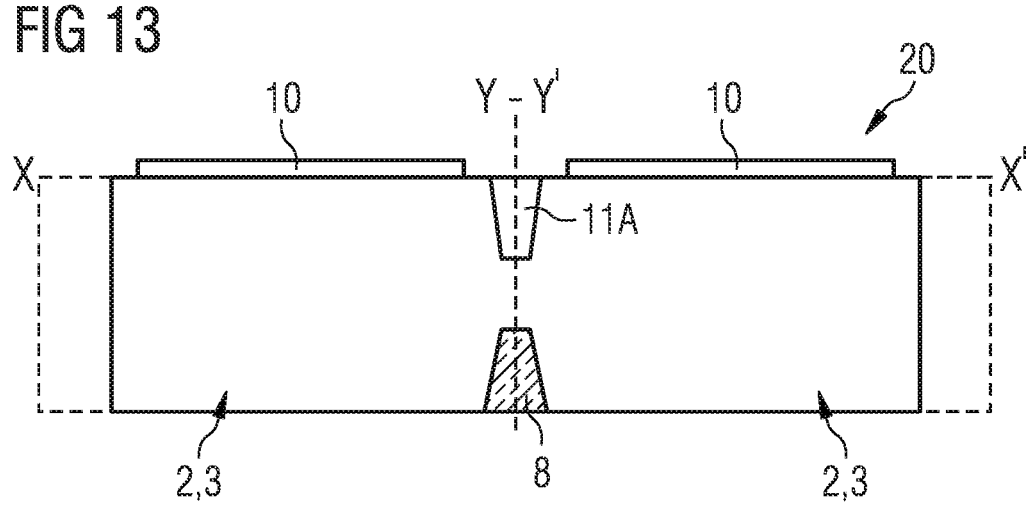
Figure 14:
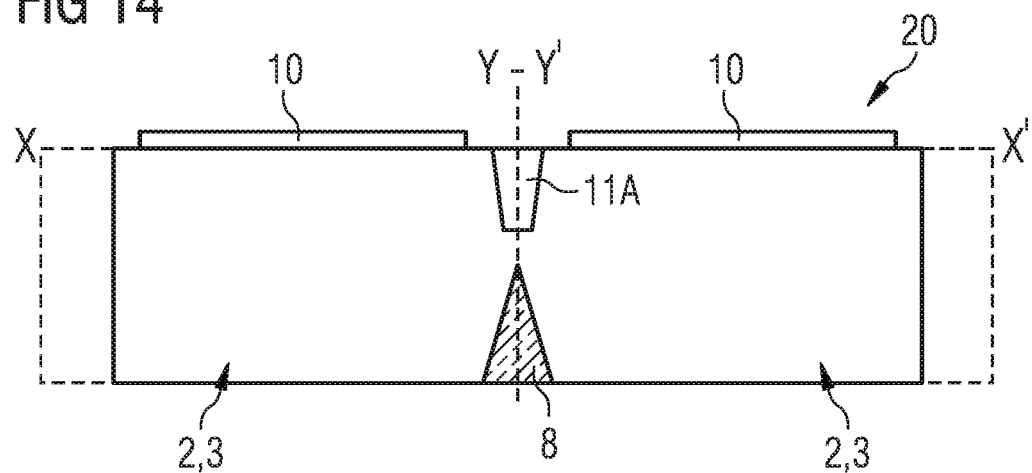
Figure 15:
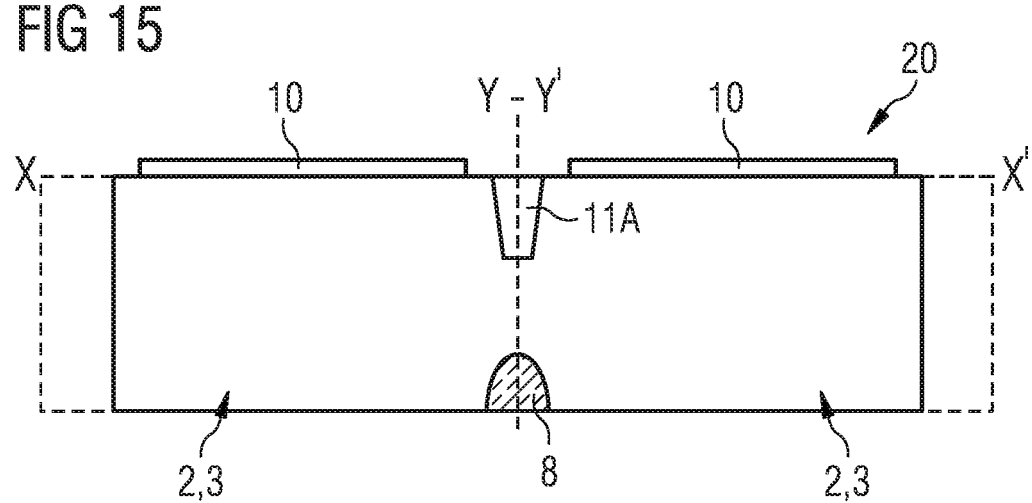

For each of the examples shown in FIGS. 2A, 4, 5, 6 and 10, a cross-sectional shape of the structured region 8 according to the examples of FIGS. 11 to 15 may be used. For the examples shown in FIGS. 7 and 8, a cross-sectional shape of the structured region 8 according to the example of FIG. 15 is particularly suitable. Furthermore, for the example shown in FIG. 9, a cross-sectional shape of the structured region 8 in accordance with the example of FIG. 12 is particularly suitable.

Figure 16A:
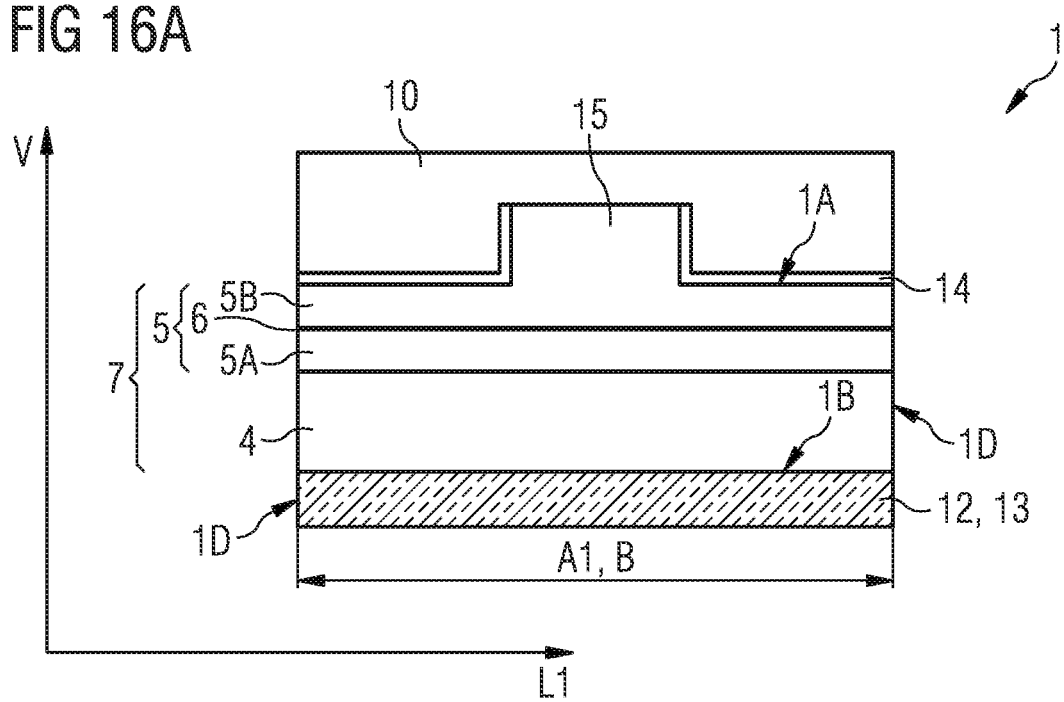
FIG. 16A shows a schematic cross-sectional view.
Figure 16B:
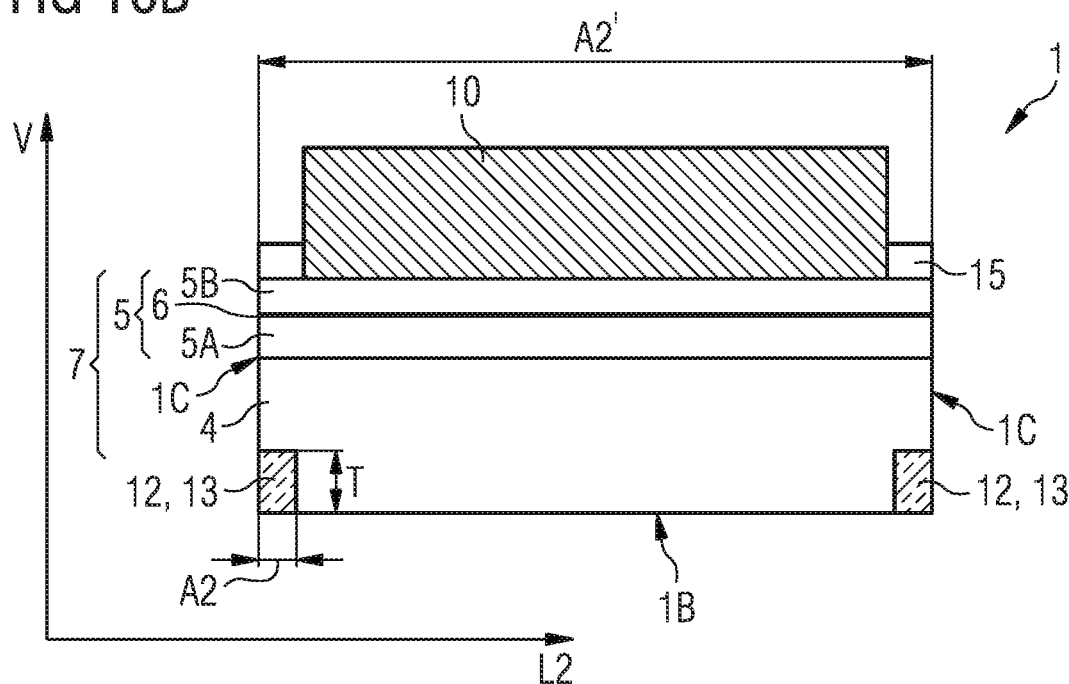
FIG. 16B shows a schematic longitudinal section view of a laser diode according to an example.

FIGS. 16A and 16B show an example of a laser diode 1 that can be produced in particular using a method or composite according to the examples of FIGS. 1, 2A, 4, 5, 6, 9 and 10.

The laser diode 1 comprises a semiconductor body 7 having a substrate 4 and a semiconductor layer sequence 5 arranged on the substrate 4 and comprises an active zone 6 suitable for generating electromagnetic radiation. Furthermore, the semiconductor layer sequence 5 has in particular an n-type semiconductor region 5A and a p-type semiconductor region 5B, the active zone 6 being arranged in between. Furthermore, the semiconductor body 7 has a first main surface 1A and a second main surface 1B opposite the first main surface 1A, and at least one first and second laser facet 1C arranged transversely to the first and second main surfaces 1A, 1B. "Transverse" means that in each example a normal vector of the laser facets 1C is not parallel to a normal vector of the first and/or second main surface(s) 1A, 1B. The laser facets 1C each delimit the semiconductor body 7 in a lateral direction L2, –L2 (see FIG. 16B). The lateral directions L2, –L2 are arranged in a plane parallel to a main plane of extension L1-L2 of the substrate 4. The first main surface 1A is preferably a surface of the semiconductor layer sequence 5 which delimits the semiconductor body 7 on a side of the active zone 6 facing away from the substrate 4. In addition to the laser facets 1C, the semiconductor body 7 has further side surfaces 1D, which are arranged transversely to the first and second main surfaces 1A, 1B, respectively.

The laser diode 1 has a web structure 15. This web structure is arranged at the first main surface 1A so that the first main surface 1A of the semiconductor layer sequence 5 is a surface composed of several partial surfaces. The laser diode 1 thus is a so-called ridge waveguide laser diode, the web structure 15 acting as a lateral waveguide for the emitted light. Furthermore, the laser diode 1 has a passivation layer 14 arranged between the semiconductor body 7 and the contact area 10. The passivation layer 14 is in particular part of the lateral waveguide. Suitable materials for the passivation layer 14 are electrically weakly or non-conductive materials, in particular silicon oxides or silicon nitrides.

The laser diode 1 has two structured facet regions 13, each located at the transition between the second main surface 1B and one of the two laser facets 1C. The structured facet region 13 has an indentation 12. In the area of the indentation 12, the semiconductor body 7 has a reduced thickness. The indentations 12 arise during the division from different depressions of the laser bar composite.

The structured facet areas 13 each extend parallel to an edge of the semiconductor body 7 located at the transition between the second main surface 1B and the laser facet 1C. In the example shown, the indentations 12 each extend over the entire width B of the laser diode 1. The indentations 12 preferably have a first lateral dimension A1 50 μm to 1000 μm, particularly preferably 100 μm to 400 μm, the limits being included. The first lateral dimension A1 is determined parallel to the first lateral direction L1. Furthermore, the indentations 12 have a second lateral dimension A2, which is determined parallel to the second lateral direction L2. The second lateral dimension A2 preferably corresponds to half the lateral dimension A of the structured region 8 (see FIG. 2B). The indentations 12 preferably have a second lateral dimension A2 of 0.25 to 25 µm, the limits being included. The laser diode 1 has a second lateral dimension A2', which is 600 to 1200 µm with possible deviations of 10%.

The indentations 12 are limited to the substrate region and do not extend to the active zone 6. The laser diode 1 therefore remains unstructured in the area of the active zone 6. The indentations 12 have a uniform depth T. The depth T can be 1 µm to 100 µm, the limits being included.

The indentations 12 have a polygonal or rectangular shape both in a cross section parallel to the laser facets 1C and in a longitudinal section perpendicular to the laser facets 1C.

The laser diode 1 is preferably an edge emitter. During operation laser radiation is emitted at one of the laser facets 1C parallel to a normal vector of the laser facet 1C.

Our methods and laser diodes are not limited by the description of the examples. Rather, this disclosure includes any new feature and any combination of features, which in particular includes any combination of features in the appended claims, even if the feature or combination itself is not explicitly mentioned in the claims or examples.

This application claims priority of DE 102017117136.3, the subject matter of which is incorporated herein by reference.

The invention claimed is:

1. A method of producing a plurality of laser diodes comprising:
providing a plurality of laser bars in a composite, wherein the laser bars each comprise a plurality of laser diode elements arranged side by side, and the laser diode elements comprise a common substrate and a semiconductor layer sequence arranged on the substrate, and a division of the composite at a longitudinal separation plane extending between two adjacent laser bars leads to formation of laser facets of the laser diodes to be produced, and
structuring the composite at at least one longitudinal separation plane, wherein a structured region is produced in the substrate,
wherein the structured region comprises a depression running continuously along the longitudinal separation plane, the depression having a composite shape composed of a larger portion and a plurality of smaller portions adjacent to the larger portion, the smaller portions each following the larger portion in a vertical direction, and the plurality of smaller portions each have a width that is larger than a width of the laser diode elements.

2. The method according to claim 1, wherein the continuously running depression has a prismatic or semi-cylindrical shape.

3. A laser diode comprising:
a semiconductor body having a substrate and a semiconductor layer sequence arranged on the substrate and comprises an active zone suitable for generating electromagnetic radiation, wherein the semiconductor body comprises a first main surface and a second main surface opposite the first main surface, and at least one first and second laser facet arranged transversely to the first and second main surfaces, and
at least one structured facet region located at a transition between the second main surface and at least one of the two laser facets, wherein the structured facet region has an indentation,
wherein the indentation extends from the substrate through the semiconductor layer sequence at most to the active zone.

4. The laser diode according to claim 3, wherein the indentation has a uniform depth and extends at most over an entire width of the laser diode.

5. A method of producing a plurality of laser diodes comprising:
providing a plurality of laser bars in a composite, wherein the laser bars each comprise a plurality of laser diode elements arranged side by side, and the laser diode elements comprise a common substrate and a semiconductor layer sequence arranged on the substrate, and a division of the composite at a longitudinal separation plane extending between two adjacent laser bars leads to formation of laser facets of the laser diodes to be produced, and
structuring the composite at at least one longitudinal separation plane, wherein a structured region is produced in the substrate, and the structured region comprises a depression running continuously along the longitudinal separation plane, the depression comprising alternately arranged regions of different depths along the longitudinal separation plane,
wherein deeper regions of the depression each have a width larger than a width of the laser diode elements.

6. The method according to claim 5, wherein the structured region extends into the substrate starting from a surface of the substrate facing away from the semiconductor layer sequence.

7. The method according to claim 5, wherein the structuring is carried out by laser etching.

8. The method according to claim 5, wherein singulation of the composite into a plurality of laser diodes is effected by breaking the composite at the longitudinal separation planes and transverse separation planes extending transversely to the longitudinal separation planes.

9. The method according to claim 5, wherein in the composite, on a side opposite the substrate at the longitudinal separation plane, separation points are produced which are provided for a targeted division of the composite.

* * * * *